(12) United States Patent
Fan

(10) Patent No.: US 11,508,604 B2
(45) Date of Patent: Nov. 22, 2022

(54) MICRO LIGHT EMITTING DIODE TRANSFER DEVICE AND TRANSFER METHOD

(71) Applicant: SHENZHEN CHINA STAR OPTOELECTRONICS SEMICONDUCTOR DISPLAY TECHNOLOGY CO., LTD., Shenzhen (CN)

(72) Inventor: Yong Fan, Shenzhen (CN)

(*) Notice: Subject to any disclaimer, the term of this patent is extended or adjusted under 35 U.S.C. 154(b) by 228 days.

(21) Appl. No.: 16/627,790

(22) PCT Filed: Dec. 16, 2019

(86) PCT No.: PCT/CN2019/125686
§ 371 (c)(1),
(2) Date: Dec. 31, 2019

(87) PCT Pub. No.: WO2021/109230
PCT Pub. Date: Jun. 10, 2021

(65) Prior Publication Data
US 2021/0335647 A1 Oct. 28, 2021

(30) Foreign Application Priority Data
Dec. 2, 2019 (CN) .......................... 201911214312.1

(51) Int. Cl.
*H01L 21/683* (2006.01)
*H01L 25/075* (2006.01)
(Continued)

(52) U.S. Cl.
CPC .... *H01L 21/6835* (2013.01); *H01L 21/68707* (2013.01); *H01L 25/0753* (2013.01);
(Continued)

(58) Field of Classification Search
CPC ....... H01L 25/075–0756; H01L 21/681; H01L 21/67115; H01L 21/67703;
(Continued)

(56) References Cited

U.S. PATENT DOCUMENTS 5,178,445 A * 1/1993 Moddel .................. G02F 1/135
349/28
5,986,736 A * 11/1999 Kodera ................ G02F 1/1339
349/154
(Continued)

FOREIGN PATENT DOCUMENTS

CN 202362559 U 8/2012
CN 107431107 A 12/2017
(Continued)

*Primary Examiner* — Lawrence C Tynes, Jr.

(57) ABSTRACT

The present disclosure provides a micro light emitting diode transfer device and a micro light emitting diode transfer method. The micro light emitting diode transfer device includes a holding member, a light source, and a liquid crystals light valve. The liquid crystals light valve is disposed on a transmission path of planar light and includes a plurality of sub light valves. The micro light emitting diodes of irradiated part can be separated from the transfer substrate and adhere to a target substrate, and thereby the micro light emitting diodes can be selectively transferred.

15 Claims, 2 Drawing Sheets

(51) Int. Cl.
*H01L 33/62* (2010.01)
*H01L 21/687* (2006.01)

(52) U.S. Cl.
CPC .... *H01L 33/62* (2013.01); *H01L 2221/68322* (2013.01); *H01L 2221/68354* (2013.01); *H01L 2221/68368* (2013.01); *H01L 2221/68381* (2013.01); *H01L 2933/0066* (2013.01)

(58) Field of Classification Search
CPC ......... H01L 21/67796; H01L 21/67132; H01L 21/67144; H01L 21/6838; H01L 21/67271; H01L 21/6835; H01L 27/124; H01L 27/1255; H01L 27/1214; H01L 27/12; H01L 27/1266; H01L 27/1203; H01L 27/1218; H01L 27/1222; H01L 27/153–156; H01L 29/78633; H01L 29/78621; H01L 29/42384; H01L 29/78603; H01L 29/78675; H01L 29/78618; H01L 69/66757; H01L 29/786; H01L 29/4908; H01L 2924/00014; H01L 2924/0002; H01L 2924/13091; H01L 2924/12032; H01L 2224/48091; H01L 2224/8592; H01L 23/4825; H01L 2221/68363; H01L 2221/68359; H01L 2221/68322; H01L 2221/68354; H01L 2221/68368; H01L 2221/68381; H01L 2933/0066; G02F 2201/06; G02F 2201/08; B25J 15/0625
See application file for complete search history.

(56) References Cited

U.S. PATENT DOCUMENTS 6,864,931 B1 * 3/2005 Kumar .............. G02F 1/133377
349/201
2001/0040651 A1 * 11/2001 Toko ....................... G02F 1/167
349/86
2002/0027630 A1 * 3/2002 Yamada ............ G02F 1/133753
349/123
2003/0214623 A1 * 11/2003 Ebisu .................. G02F 1/13394
349/156
2005/0068482 A1 * 3/2005 Kume .................. G02F 1/1393
349/156
2007/0121050 A1 * 5/2007 Toriyama .............. G02F 1/1339
349/153
2007/0146910 A1 * 6/2007 Duston ..................... G02F 1/29
359/834
2010/0118219 A1 * 5/2010 Leister .................. G02F 1/1393
349/18
2011/0141422 A1 * 6/2011 Yanagawa ......... G02F 1/134336
349/139
2011/0317116 A1 * 12/2011 Kawamura ........... G02F 1/1393
349/123
2012/0013594 A1 * 1/2012 Ishihara ............... G09G 3/3659
345/87
2013/0082986 A1 * 4/2013 Yamauchi ............ H04N 9/3102
349/5
2016/0103369 A1 * 4/2016 Imanishi .......... G02F 1/133711
438/106
2017/0263593 A1 9/2017 Zou et al.
2018/0284514 A1 * 10/2018 Nakamura .......... E06B 3/66304
2019/0027642 A1 1/2019 Zou
2019/0393066 A1 * 12/2019 Hong .................. H01L 33/0095
2020/0051513 A1 * 2/2020 Fattal .................. G02B 6/0068
2020/0159055 A1 * 5/2020 Robinson ................ G02F 1/137
2020/0227484 A1 * 7/2020 Lin ..................... H01L 51/5284
2020/0409208 A1 * 12/2020 Li ..................... B32B 17/10045

FOREIGN PATENT DOCUMENTS

CN 107919414 A 4/2018
CN 108962789 A 12/2018

* cited by examiner

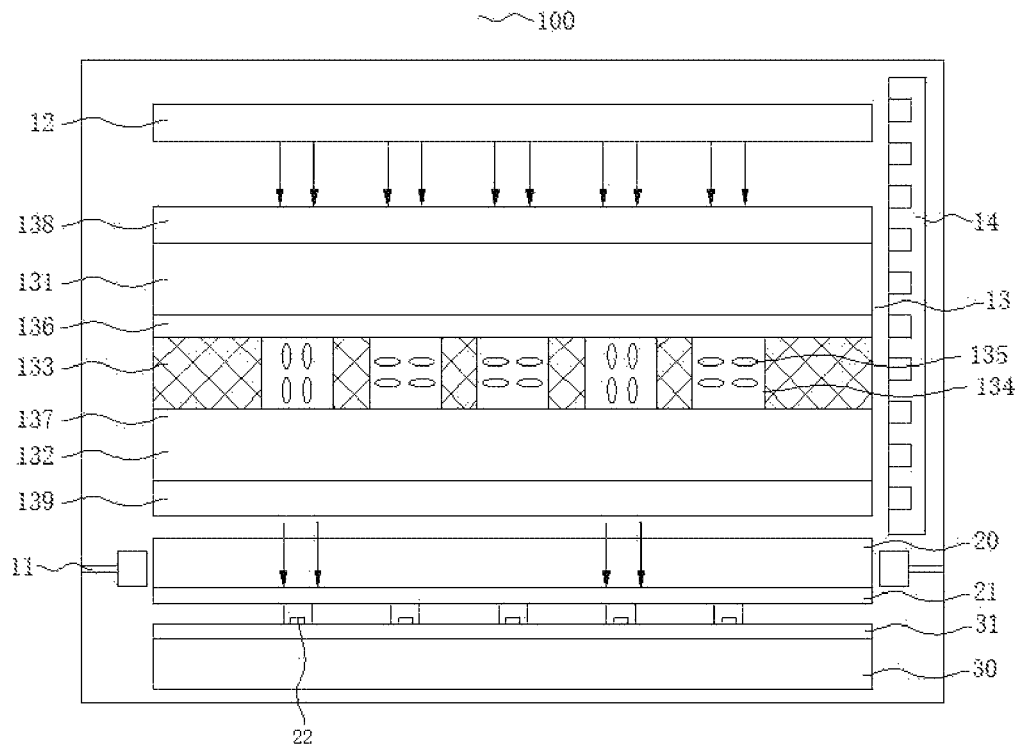

FIG. 1

Providing a transfer substrate, wherein a photosensitive adhesive layer is provided on a side of the transfer substrate, and a plurality of micro light emitting diodes are arranged on the transfer substrate in array through the photosensitive adhesive layer — S10

Irradiating the photosensitive adhesive layer in target areas on the transfer substrate by light emitted by a light source passing through a liquid crystals light valve to reduce adhesion of the photosensitive adhesive layer, so that the micro light emitting diodes are detached and adhere to a target substrate — S20

FIG. 2

MICRO LIGHT EMITTING DIODE TRANSFER DEVICE AND TRANSFER METHOD

FIELD OF INVENTION

The present disclosure relates to the technology field of displays, and particularly, relates to a micro light emitting diode transfer device and a micro light emitting diode transfer method.

BACKGROUND OF INVENTION

Micro light emitting diode (micro LED) display devices belong to a new-generation display technology, and the devices have a structure of a miniaturized LEDs array, that is, micro sized LED arrays with a high density are integrated on a substrate, so the micro LED technology can be regarded as a technology of LED miniaturization and LED matrix.

Technical Problems

When micro LEDs are applied in a display device, a substrate located at a bottom of the LEDs needs to be removed, and then the micro LEDs are transferred to a stretch-resistant organic substrate through a mass transfer method. The rapid and selective mass transfer can be achieved by a structural transfer head through intermolecular forces. However, a fabrication of the structural transfer head is complicated, and only fixed micro LEDs can be array transferred by the structural transfer head. In actual production, the positions of the micro LEDs with defects are uncertain because they are located among the massive arrayed micro LEDs. Hence, how to selectively transfer massive micro LEDs is the key to achieving ultimate yield improvement and cost reduction.

In summary, micro light emitting diode transfer devices in prior art cannot selectively transfer massive micro LEDs. Therefore, it is necessary to provide a micro light emitting diode transfer device and a micro light emitting diode transfer method to improve this defect.

Technical Solutions

Embodiments of the present disclosure provide a micro light emitting diode transfer device and a micro light emitting diode transfer method to solve the problem that the micro LEDs transfer device in prior art cannot selectively transfer the massive micro LEDs.

An embodiment of the present disclosure provides a micro light emitting diode transfer device, including:
  a holding member for holding a transfer substrate;
  a light source for providing planar light; and
  a liquid crystals light valve disposed on a transmission path of the planar light; the liquid crystals light valve comprises a plurality of sub light valves, and the sub light valves are corresponding to micro light emitting diodes on the transfer substrate.

According to an embodiment of the present disclosure, the micro light emitting diode transfer device further includes an adsorption member, and the adsorption member is configured for adsorbing and transferring substandard micro light emitting diodes on a target substrate.

According to an embodiment of the present disclosure, the liquid crystals light valve includes a first substrate, a second substrate opposite to the first substrate, and light blocking walls disposed in crisscross manner between the first substrate and the second substrate; the adjacent light blocking walls, the first substrate, and the second substrate form the sub light valves, and the sub light valves are filled with liquid crystals.

According to an embodiment of the present disclosure, a first driving electrode is provided on a side of the first substrate close to the second substrate, a second driving electrode is provided on a side of the second substrate close to the first substrate, and both of the first driving electrode and the second driving electrode are made of transparent conductive materials.

According to an embodiment of the present disclosure, a driving method of the second driving electrode is an active matrix driving method or a passive matrix driving method.

According to an embodiment of the present disclosure, a first polarizer is provided on a side of the first substrate away from the second substrate, a second polarizer is provided on a side of the second substrate away from the first substrate, and both of the first polarizer and the second polarizer are metal wire grid polarizers.

According to an embodiment of the present disclosure, the light source is an ultraviolet light source or an infrared light source.

An embodiment of the present disclosure also provides a micro light emitting diode transfer device, including:
  a holding member for holding a transfer substrate;
  a light source for providing planar light; and
  a liquid crystals light valve disposed on a transmission path of the planar light including a first substrate, a second substrate opposite to the first substrate, and light blocking walls disposed in crisscross manner between the first substrate and the second substrate; the adjacent light blocking walls, the first substrate, and the second substrate form a plurality of sub light valves, and the plurality of sub light valves are corresponding to micro light emitting diodes on the transfer substrate.

According to an embodiment of the present disclosure, the micro light emitting diode transfer device further includes an adsorption member, and the adsorption member is configured for adsorbing and transferring substandard micro light emitting diodes on a target substrate.

According to an embodiment of the present disclosure, a first driving electrode is provided on a side of the first substrate close to the second substrate, a second driving electrode is provided on a side of the second substrate close to the first substrate, and both of the first driving electrode and the second driving electrode are made of transparent conductive materials.

According to an embodiment of the present disclosure, a driving method of the second driving electrode is an active matrix driving method or a passive matrix driving method.

According to an embodiment of the present disclosure, a first polarizer is provided on a side of the first substrate away from the second substrate, a second polarizer is provided on a side of the second substrate away from the first substrate, and both of the first polarizer and the second polarizer are metal wire grid polarizers.

According to an embodiment of the present disclosure, the light source is an ultraviolet light source or an infrared light source.

An embodiment of the present disclosure also provides a micro light emitting diode transfer method, including:
  providing a transfer substrate, wherein a photosensitive adhesive layer is provided on a side of the transfer substrate, and a plurality of micro light emitting diodes are arranged on the transfer substrate in array through the photosensitive adhesive layer; and irradiating the photosensitive adhesive layer in target areas on the transfer substrate by light emitted by a light source passing through a liquid crystals light valve to reduce adhesion of the photosensitive adhesive layer, so that the micro light emitting diodes are detached and adhere to a target substrate.

According to an embodiment of the present disclosure, the target area are areas in which substandard micro light emitting diodes that are removed from the target substrate, and the micro light emitting diode transfer method further includes:

detecting the target substrate before transfer in order to detect the substandard micro light emitting diodes on the target substrate; and adsorbing and transferring the substandard micro light emitting diodes by an adsorption member.

According to an embodiment of the present disclosure, a material of the photosensitive adhesive layer is an ultraviolet light-sensitive adhesive or an infrared light-sensitive adhesive.

Beneficial Effect

Beneficial effects of the embodiments according to the present disclosure are: a liquid crystals light valve is added in the micro light emitting diode transfer device of the embodiment according to the present disclosure, and the liquid crystals light valve includes a plurality of sub light valves corresponding to the micro LEDs on a transfer substrate. Light passing through the liquid crystals light valve is filtrated by controlling the sub light valves to be on or off, so that the transfer substrate is selectively irradiated. Irradiated micro LEDs detach from the transfer substrate because of the reduction of adhesion of the photosensitive adhesive layer under irradiation, and the irradiated micro LEDs further adhere to a target substrate, so that the massive micro LEDs can be selectively transferred.

DESCRIPTION OF DRAWINGS

In order to more clearly illustrate the technical solutions in the embodiments or the prior art, the drawings to be used in the descriptions of the embodiments or the prior art will be briefly described below. Obviously, the drawings in the following description are merely embodiments of the present disclosure. For those of ordinary skill in the art, other drawings may be obtained from the drawings without any creative work.

FIG. 1 is a cross-sectional and schematic view of a micro light emitting diode transfer device of an embodiment according to the present disclosure.

FIG. 2 is a process diagram of a micro light emitting diode transfer method of an embodiment according to the present disclosure.

DETAILED DESCRIPTION OF EMBODIMENTS

Figure 3:
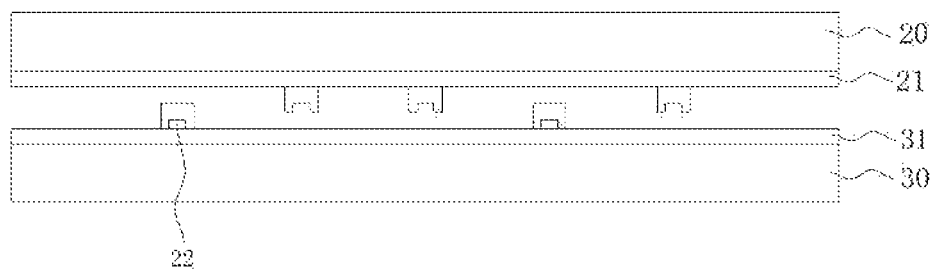
FIG. 3 is a cross-sectional and schematic view of a transfer substrate and a target substrate of an embodiment according to the present disclosure.

The following description of the various embodiments refers to the accompanying drawings, and is provided to illustrate the specific embodiments of the invention. Orientational relationships represented by directional terms mentioned in the present disclosure, such as "up", "down", "front", "rear", "left", "right", "inner", "outer", or "lateral", etc. are orientation relations based on illustration of the drawings. So, the orientation relations used are for describing and understanding of the present disclosure, rather than limiting the present disclosure. In the figures, structurally similar elements are denoted by the same reference numerals.

The disclosure is further described below with reference to the drawings and specific embodiments:

A micro light emitting diode transfer device provided by an embodiment of the present disclosure is described in detail below with reference to FIG. 1. As shown in FIG. 1, it is a schematic view of the micro light emitting diode transfer device 100 provided by an embodiment of the present disclosure. The micro light emitting diode transfer device 100 includes a holding member 11, a light source 12, and a liquid crystals light valve 13. The holding member 11 is configured for holding a transfer substrate 20. The light source 12 is used for providing planar light. The liquid crystals light valve 13 is disposed on a transmission path of the planar light and is configured for filtrating the light emitted by the light source 12, so that the transfer substrate 20 is selectively irradiated.

A photosensitive adhesive layer 21 is provided on a side of the transfer substrate 20, and a plurality of micro LEDs 22 are arranged on the transfer substrate 20 through the photosensitive adhesive layer 21. The light emitted by the light source 12 passing through the liquid crystals light valve 13 is irradiated to the photosensitive adhesive layer 21, which can reduce adhesion of the photosensitive adhesive layer 21, and thereby, the corresponding micro LEDs 22 detach from the transfer substrate 20 and further adhere to a target substrate 30.

As shown in FIG. 1, the liquid crystals light valve 13 includes a first substrate 131, a second substrate 132 opposite to the first substrate 131, and light blocking walls 133 disposed in crisscross manner between the first substrate 131 and the second substrate 132. The adjacent light blocking walls 133, the first substrate 131, and the second substrate 132 form sub light valves 134. The sub light valves 134 are filled with liquid crystals 135. The sub light valves 134 are corresponding to micro LEDs 22 on the transfer substrate 20. The sub light valves are on or off to let the light pass or be filtrated, so that the photosensitive adhesive layer 21 on the transfer substrate 20 is selectively irradiated. The light blocking walls 133 can effectively prevent the light emitted by the light source 12 from cross-talking to the adjacent sub light valves 134 in the sub light values 134, so that a collimation of the light emitted by the light source 12 is improved without affecting the adhesion of the photosensitive adhesive layer corresponding to the adjacent micro LEDs.

Preferably, both of the first substrate 131 and the second substrate 132 are made of transparent polyimide to improve a light transmittance of the light emitted by the light source 12 at the liquid crystals light valve 13. Of course, in some embodiments, materials of the first substrate 131 and the second substrate 132 may also be other transparent materials, which are not limited here.

Preferably, in order to improve a response speed of the liquid crystals 135 in the sub light valves 134, the liquid crystals 135 may be selected from ferroelectric liquid crystal, TN liquid crystal, OCB liquid crystal, PVA liquid crystal, or IPS liquid crystal. The above types of liquid crystals all have a high response speed, so that the sub light valves 134 can be precisely turned on or off.

In an embodiment of the present disclosure, a first driving electrode 136 is provided on a side of the first substrate 131 close to the second substrate 132, a second driving electrode 137 is provided on a side of the second substrate 132 close to the first substrate 131. After powering on, an electric filed is defined between the first driving electrode 136 and the second driving electrode 137 to control a deflection direction of the liquid crystals in the sub light valves 134, thereby turning on or off the sub light valves 134.

Preferably, to improve the light transmittance of the light emitted by the light source 12 at the liquid crystals light valve 13, both of the first driving electrode 136 and the second driving electrode 137 are made of transparent conductive materials, such as the transparent metal oxide conductive material ITO.

Preferably, a driving method of the second driving electrode 137 is an active matrix driving method or a passive matrix driving method. Each sub light valve 134 can be precisely controlled to be on or off through the active matrix driving method or the passive matrix driving method.

In this embodiment, a first polarizer 138 is provided on a side of the first substrate 131 away from the second substrate 132, a second polarizer 139 is provided on a side of the second substrate 132 away from the first substrate 131, and the second polarizer 139 is disposed correspondingly to the first polarizer 138. Both of the first polarizer 138 and the second polarizer 139 are metal wire grid polarizers which filtrate the light emitted by the light source and meanwhile reduce absorption of the light, so that the light transmittance of the light emitted by the light source 12 can be improved.

In this embodiment, the light source 12 is an ultraviolet light source, and the photosensitive adhesive layer 21 corresponding to the transfer substrate 20 is an ultraviolet light-sensitive adhesive. In some embodiments, the light source 12 may also be an infrared light source, a visible light source, or a laser light source, and the material of the photosensitive adhesive layer 21 should be a photosensitive adhesive corresponding to the light source, which is not specifically limited here.

The micro light emitting diode transfer device 100 provided in the embodiment of the present disclosure is suitable for a mass transfer of the micro LEDs after fabrication, and the micro LEDs on the transfer substrate 20 may be entirely transferred or selectively transferred. After mass transfer, the micro light emitting diode transfer device 100 is also suitable for repairing massive, unfixed, and substandard micro LEDs on the target substrate.

As shown in FIG. 1, the micro light emitting diode transfer device further includes an adsorption member 14. The adsorption member 14 is configured for adsorbing and transferring the substandard micro LEDs on the target substrate 30. After the target substrate 30 is detected, the substandard micro LEDs are detected, bonding legs between the micro LEDs and the target substrate 30 are cut by a laser, and then the substandard micro LEDs are adsorbed and transferred by the adsorption member 14. At this time, vacant target areas are formed on the target substrate 30. The target areas are not fixed, and the number of the target areas may be one or multiple. The number of the micro LEDs in the target areas may also be multiple. The micro LEDs 22, which are one-to-one corresponding to those on the target substrate 30, are adhered to the transfer substrate 20.

The liquid crystals in the sub light valves 134 in the target areas are deflected after the first driving electrode 136 and the second driving electrode 137 power on. After passing through the light valve 13, the light emitted by the light source is used to irradiate the photosensitive adhesive layer 21 on the transfer substrate 20 corresponding to the target areas to weaken the adhesion of the photosensitive adhesive layer 21, so that the micro LEDs 22 on the transfer substrate 21 are detached and are further adhered to an adhesive layer 31 on the target substrate 30 to fill the vacancies in the target areas in which the substandard micro LEDs are removed. Hence, the micro light emitting diode transfer device provided by the embodiment of the present disclosure can rapidly repair the defects of the massive unfixed micro LEDs on the target substrate, thereby improving repair efficiency and production yield.

In the embodiment of the present disclosure, the adsorption member 14 is a vacuum adsorption device with a plurality of adsorption holes, which can adsorb and transfer the massive micro LEDs in different areas. Of course, in some embodiments, the adsorption member 14 may also adopt a magnetic adsorption device or an electrostatic adsorption device, and both can achieve the same technical effect, which will not be repeated here.

Beneficial effects of the embodiment according to the present disclosure are: a liquid crystals light valve is added in the micro light emitting diode transfer device of the embodiment according to the present disclosure, and the liquid crystals light valve includes a plurality of sub light valves corresponding to the micro LEDs on the transfer substrate. Light passing through the liquid crystals light valve is filtrated, so that the transfer substrate is selectively irradiated. The irradiated micro LEDs detach from the transfer substrate and adhere to the target substrate, so that a selective mass transfer of the micro LEDs is achieved and the massive micro LEDs are rapidly repaired, thereby improving repair efficiency, production efficiency, and production yield, and reducing actual production costs.

An embodiment of the present disclosure further provides a micro light emitting diode transfer method, and the micro light emitting diode transfer method adopts the above micro light emitting diode transfer device. Detailed description is given below with reference to FIGS. 1 to 4.

As shown in FIG. 2, it is a process diagram of the micro light emitting diode transfer method of an embodiment according to the present disclosure. The manufacturing method includes:

Step S10: as shown in FIG. 1, a transfer substrate 20 is provided, a photosensitive adhesive layer 21 is provided on a side of the transfer substrate 20, a plurality of micro LEDs 22 are mounted on the transfer substrate 20 in array through the photosensitive adhesive layer 22; and Step S20: parts of the photosensitive adhesive layer 21 on the transfer substrate 20 in target areas are irradiated by light emitted from a light source 12 and through a liquid crystals light valve 13 to reduce adhesion of the photosensitive adhesive layer 21, so that the micro LEDs 22 are detached and adhere to an adhesive layer 31 of a target substrate 30.

As shown in FIG. 3, it is a cross-sectional and schematic view of a transfer substrate and a target substrate of an embodiment according to the present disclosure. As the adhesion of the photosensitive adhesive layer 22 to which the micro LEDs 22 are bonded weakens, these micro LEDs 22 in the target areas detach from the transfer substrate 20 and adhere to the adhesive layer 31 of the target substrate 30, and the unirradiated micro LEDs 22 remain on the transfer substrate 20.

If the micro LEDs 22 on the transfer substrate 20 need to be entirely transferred, all of the sub light valves 134 in the liquid crystals light valve 13 are turned on by the first driving electrode 136 and the second driving electrode 137, and thus all of the micro LEDs 22 are transferred to the target substrate 30 to achieve the mass transfer of the micro LEDs.

After the mass transfer is performed, the micro light emitting diode transfer method provided in the embodiment of the present disclosure can also be suitable for repairing the massive, unfixed, and substandard micro LEDs. At this time, the target areas are the areas on the target substrate 30 where the substandard micro LEDs detached from. The micro light emitting diode transfer method in the embodiment of the present disclosure further includes:

Detecting the target substrate 32 before transfer in order to detect the substandard micro LEDs 32 on the target substrate 30;

Cutting bonding legs between the substandard micro LEDs 32 and the target substrate 30 by a laser; and Adsorbing and transferring the substandard micro LEDs 32 by an adsorption member 14.

Figure 4:
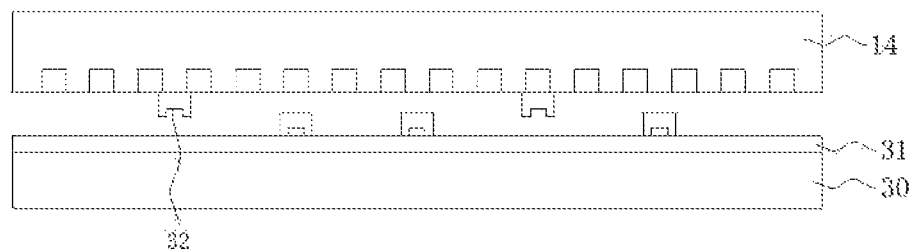
FIG. 4 is a cross-sectional and schematic view of a target substrate of an embodiment according to the present disclosure.

As shown in FIG. 4, it is a cross-sectional and schematic view of the target substrate 32 of an embodiment according to the present disclosure. The adsorption member 14 adsorbs and transfers the micro LEDs 32 by adsorption holes thereon, thereby defining vacancies in the target areas, and then through steps S10 and S20 of the method the vacancies in the target areas can be filled with the micro LEDs to repair the defects in the target substrate 30.

In this embodiment, the light source 12 is an ultraviolet light source, and the photosensitive adhesive layer 21 corresponding to the transfer substrate 20 is an ultraviolet light-sensitive adhesive. In some embodiments, the light source 12 may also be an infrared light source, a visible light source, or a laser light source, and the material of the photosensitive adhesive layer 21 should be a photosensitive adhesive corresponding to the light source.

In the micro light emitting diode transfer method of the embodiment according to the present disclosure, the light emitted by the light source selectively irradiates the photosensitive adhesive layer on the transfer substrate by controlling the sub light valves in the liquid crystals light valve to be on or off, and the irradiated micro LEDs are then transferred to the target substrate, that is, a mass transfer of the micro LEDs is achieved. After the mass transfer is performed, massive and unfixed defects of the substandard micro LEDs are repaired, thereby improving production efficiency, repair efficiency, and production yield, and reducing actual production costs.

In the above, the present disclosure has been disclosed as above in the preferred embodiments. However, the preferred embodiments should not be construed as limitations of the present disclosure. Those skilled in the art can make various modifications without departing from the spirit and scope of the present disclosure. Hence, the scope of the present disclosure should be subject to the scope defined in the claims.

What is claimed is:

1. A micro light emitting diode transfer device, comprising:
   a holding member for holding a transfer substrate;
   a light source for providing planar light; and
   a liquid crystals light valve disposed on a transmission path of the planar light; and
   wherein the liquid crystals light valve comprises a plurality of sub light valves, and the sub light valves are corresponding to micro light emitting diodes on the transfer substrate, and
   wherein the liquid crystals light valve comprises: a first substrate: a second substrate opposite to the first substrate; and light blocking walls disposed in crisscross manner between the first substrate and the second substrate; and wherein the adjacent light blocking, walls, the first substrate, and the second substrate form the sub light valves, and the sub light valves are filled with liquid crystals.

2. The micro light emitting diode transfer device as claimed in claim 1, wherein the micro light emitting diode transfer device further comprises an adsorption member, and the adsorption member is configured tier adsorbing and transferring substandard micro light emitting diodes on a target substrate.

3. The micro light emitting diode transfer device as claimed in claim 1, wherein a first driving electrode is provided on a side of the first substrate close to the second substrate, a second driving electrode is provided on a side of the second substrate close to the first substrate, and both of the first driving electrode and the second driving electrode are made of transparent conductive materials.

4. The micro light emitting diode transfer device as claimed in claim 3, wherein a driving method of the second driving electrode is an active matrix driving method or a passive matrix driving method.

5. The micro light emitting diode transfer device as claimed in claim 3, wherein a first polarizer is provided on a side of the first substrate away from the second substrate, a second polarizer is provided on a side of the second substrate away from the first substrate, and both of the first polarizer and the second polarizer are metal wire grid polarizers.

6. The micro light emitting diode transfer device as claimed in claim 1, wherein the light source is an ultraviolet light source or an infrared light source.

7. A micro light emitting diode transfer method of using the micro light emitting diode transfer device as claimed in 1, comprising:
   providing the transfer substrate, wherein a photosensitive adhesive layer is provided on a side of the transfer substrate, and a plurality of micro light emitting diodes are arranged on the transfer substrate in array through the photosensitive adhesive layer; and
   irradiating the photosensitive adhesive layer in target areas on the transfer substrate by light emitted by the light source passing through the liquid crystals light valve to reduce adhesion of the photosensitive adhesive layer, so that the micro light emitting diodes are detached and adhere to a target substrate.

8. The micro light emitting diode transfer method as claimed in claim 7, wherein the target area are areas in which substandard micro light emitting diodes that are removed from the target substrate, and the micro light emitting diode transfer method further comprises:
   detecting the target substrate before transfer in order to detect the substandard micro light emitting diodes on the target substrate; and
   adsorbing and transferring the substandard micro light emitting diodes by an adsorption member.

9. The micro light emitting diode transfer method as claimed in claim 8, wherein a material of the photosensitive adhesive layer is an ultraviolet light-sensitive adhesive or an infrared light-sensitive adhesive.

10. A micro light emitting diode transfer device, comprising:
   a holding member for holding a transfer substrate;
   a light source for providing planar light; and
   a liquid crystals light valve disposed on a transmission path of the planar light, comprising:

a first substrate;

a second substrate opposite to the first substrate; and light blocking walls disposed in crisscross manner between the first substrate and the second substrate;

wherein the adjacent light blocking walls, the first substrate, and the second substrate form a plurality of sub light valves, and the plurality of sub light valves are corresponding to micro light emitting diodes on the transfer substrate.

11. The micro light emitting diode transfer device as claimed in claim 10, further comprising an adsorption member, and wherein the adsorption member is configured for adsorbing and transferring substandard micro light emitting diodes on a target substrate.

12. The micro light emitting diode transfer device as claimed in claim 10, wherein a first driving electrode is provided on a side of the first substrate close to the second substrate, a second driving electrode is provided on a side of the second substrate close to the first substrate, and both of the first driving electrode and the second driving electrode are made of transparent conductive materials.

13. The micro light emitting diode transfer device as claimed in claim 12, wherein a driving method of the second driving electrode is an active matrix driving method or a passive matrix driving method.

14. The micro light emitting diode transfer device as claimed in claim 12, wherein a first polarizer is provided on a side of the first substrate away from the second substrate, a second polarizer is provided on a side of the second substrate away from the first substrate, and both of the first polarizer and the second polarizer are metal wire grid polarizers.

15. The micro light emitting diode transfer device as claimed in claim 10, wherein the light source is an ultraviolet light source or an infrared light source.

* * * * *